United States Patent
Lee et al.

(10) Patent No.: US 7,375,767 B2
(45) Date of Patent: May 20, 2008

(54) METHOD OF CONVERTING RESOLUTION OF VIDEO SIGNALS AND APPARATUS USING THE SAME

(75) Inventors: Hoyoung Lee, Gyeonggi-do (KR); Changyeong Kim, Gyeonggi-do (KR); Dusik Park, Gyeonggi-do (KR); Seongdeok Lee, Gyeonggi-do (KR); Alexey Lukin, Moscow (RU)

(73) Assignee: Samsung Electronics Co., Ltd., Suwon-Si (KR)

( * ) Notice: Subject to any disclaimer, the term of this patent is extended or adjusted under 35 U.S.C. 154(b) by 612 days.

(21) Appl. No.: 10/994,279

(22) Filed: Nov. 23, 2004

(65) Prior Publication Data
US 2005/0134731 A1 Jun. 23, 2005

(30) Foreign Application Priority Data
Nov. 24, 2003 (KR) ............ 10-2003-0083612

(51) Int. Cl.
*H04N 1/393* (2006.01)
*H04N 7/01* (2006.01)
(52) U.S. Cl. .............. 348/581; 348/441; 348/561; 382/299; 382/298
(58) Field of Classification Search ............ 348/441, 348/445, 458, 459, 561, 581, 704, 708; 382/298, 382/299, 300; 345/660, 670, 671; 358/451; 702/197
See application file for complete search history.

(56) References Cited

U.S. PATENT DOCUMENTS

| | | | |
|---|---|---|---|
| 5,243,433 A * | 9/1993 | Hailey .................... 348/240.2 |
| 5,404,322 A | 4/1995 | Gehring |
| 5,422,827 A * | 6/1995 | Niehaus .................... 702/190 |
| 5,446,804 A | 8/1995 | Allebach et al. |
| 5,495,432 A | 2/1996 | Ho et al. |
| 5,587,742 A * | 12/1996 | Hau et al. .................... 348/441 |
| 5,602,870 A * | 2/1997 | Hailey et al. ............... 375/230 |
| 5,629,719 A * | 5/1997 | Cahill, III .................... 345/620 |
| 5,671,298 A | 9/1997 | Markandey et al. |

(Continued)

FOREIGN PATENT DOCUMENTS

EP 0 629 044 12/1994

OTHER PUBLICATIONS

European Search Report (in English) issued Mar. 14, 2005 for corresponding European patent application.

*Primary Examiner*—David Ometz
*Assistant Examiner*—Jean W. Désir
(74) *Attorney, Agent, or Firm*—Staas & Halsey LLP

(57) ABSTRACT

A method converts a resolution of video signals, the method including: calculating up-sampling and down-sampling ratios based on a resolution of an input video signal and a desired resolution of an output video signal; calculating a number of filter tabs by multiplying the up-sampling and down-sampling ratios by a number of side lobes; calculating first filter coefficients of a same number of the filter tabs by multiplying a window function by a sinc function; calculating final filter coefficients by subtracting a result of a multiplication of a Gaussian function by a window function from the first filter coefficients, and then normalizing the final filter coefficients; and performing filtering in vertical and horizontal directions based on the final filter coefficients by modifying a sampling rate of an input video signal depending on the up-sampling and down-sampling ratios, to obtain clear video images.

30 Claims, 7 Drawing Sheets

U.S. PATENT DOCUMENTS

| | | |
|---|---|---|
| 5,852,470 A | 12/1998 | Kondo et al. |
| 5,889,895 A | 3/1999 | Wong et al. |
| 5,974,159 A * | 10/1999 | Lubin et al. ................. 382/106 |
| 6,061,477 A * | 5/2000 | Lohmeyer et al. .......... 382/300 |
| 6,108,047 A * | 8/2000 | Chen ........................... 348/581 |
| 6,177,922 B1 * | 1/2001 | Schiefer et al. ............. 345/698 |
| 6,281,873 B1 * | 8/2001 | Oakley ....................... 345/418 |
| 6,347,154 B1 * | 2/2002 | Karanovic et al. .......... 382/233 |
| 6,377,628 B1 * | 4/2002 | Schultz et al. ......... 375/240.26 |
| 6,483,951 B1 * | 11/2002 | Mendenhall et al. ....... 382/300 |
| 6,519,288 B1 * | 2/2003 | Vetro et al. ............ 375/240.21 |
| 6,661,427 B1 * | 12/2003 | MacInnis et al. ........... 345/660 |
| 6,690,427 B2 * | 2/2004 | Swan .......................... 348/448 |
| 6,724,948 B1 * | 4/2004 | Lippincott ................... 382/298 |
| 6,738,072 B1 * | 5/2004 | MacInnis et al. ........... 345/629 |
| 6,937,291 B1 * | 8/2005 | Gryskiewicz ............... 348/581 |
| 7,133,569 B1 * | 11/2006 | Saquib ........................ 382/262 |
| 7,254,174 B2 * | 8/2007 | Pau et al. ............... 375/240.01 |
| 7,259,796 B2 * | 8/2007 | Sha et al. .................... 348/581 |
| 2002/0145610 A1 * | 10/2002 | Barilovits et al. ........... 345/538 |
| 2002/0196853 A1 * | 12/2002 | Liang et al. ............ 375/240.16 |
| 2003/0058368 A1 * | 3/2003 | Champion ................... 348/581 |
| 2003/0080981 A1 * | 5/2003 | Lin et al. .................... 345/660 |
| 2004/0145501 A1 * | 7/2004 | Hung .......................... 341/61 |

* cited by examiner

METHOD OF CONVERTING RESOLUTION OF VIDEO SIGNALS AND APPARATUS USING THE SAME

CROSS-REFERENCE TO RELATED APPLICATIONS

This application claims the priority of Korean Patent Application No. 2003-83612, filed on Nov. 24, 2003, in the Korean Intellectual Property Office, the disclosure of which is incorporated herein in its entirety by reference.

BACKGROUND OF THE INVENTION

1. Field of the Invention

The present invention relates to a method of converting input video signals to have a desired resolution and an apparatus using the same, and more particularly, to a method of converting a resolution of video signals, by which the details of the input video may be provided in high definition without additional definition enhancement circuits, such as a peaking circuit, by filtering video signals with optimal filter coefficients being calculated based on a resolution of input and output video signals, and an apparatus using the same.

2. Description of the Related Art

Since digital display devices, such as a liquid crystal display (LCD), a digital micro-mirror device (DMD), and a plasma display panel (PDP), have a display resolution fixed for each product model, a video input to the individual digital display device has different resolutions, and thus, should be converted to have a resolution adjusted to a corresponding display device.

Particularly, a resolution conversion technique is required to convert a variety of digital television formats, defined by the advanced television system committee (ATSC), into a format which may be reproduced in a high definition television (HDTV).

The resolution conversion techniques allow for the converting of a sampling rate of an input video signal, and the conversion techniques are classified into a resolution extension to convert a low-resolution format into a high definition format and a resolution reduction to convert a high-resolution format into a low-resolution format. In the case of the resolution extension, since new signal components are interpolated between samples of an original input signal, a blurring takes place due to losses of high frequency components when the signals are being filtered. Therefore, users can readily recognize a deterioration of display quality when standard definition (SD) video signals are reproduced on a high definition digital display device, such as the HDTV.

Also, in the case of the resolution reduction, since high frequency components in an input video are aliased on a low frequency signal, deterioration, such as a zigzag artifact and a moiré pattern, occurs.

According to conventional linear filtering techniques as disclosed in U.S. Pat. No. 5,889,895 and U.S. Pat. No. 5,671,298, resolution conversion is accomplished by using a bilinear interpolation and a cubic interpolation. However, since high frequency components of the input video are not sufficiently extended during the resolution extension, both the definition and the display quality deteriorate. To compensate for such a problem, a method was proposed in which a peaking is applied to a low resolution video to identify potential edge pixels, and then edge pixel detection, edge linking, and luminance transition enhancement are sequentially accomplished so as to output high definition video signals. However, such a scaling method uses a conventional linear filter, and thus, has a problem that both pre-processing and post-processing require an increase in arithmetic operations and additional hardware, thus causing costs to increase because the peaking and the luminance transition enhancement should be accomplished for the video signals in both pre-processing and post-processing stages during filtering to improve the display quality and the definition of a video.

In addition, according to the conventional art disclosed in U.S. Pat. No. 5,852,470 and U.S. Pat. No. 5,446,804, video signals corresponding to the edge regions are processed satisfactorily. However, fine textured regions of a video cannot be processed with high definition. In addition, their performances are unsatisfactory compared to the linear filtering technique, with the exception of most regions of the edge components.

SUMMARY OF THE INVENTION

The present invention provides a method of converting a resolution, to reproduce clearly an input video with a desired resolution with neither pre-processing nor post-processing, such as a peaking or a luminance transition enhancement during a resolution conversion process, by calculating optimal filter coefficients based on each resolution of input and output video signals and applying the coefficients to a scaling filter, and an apparatus using the same.

According to an aspect of the present invention, a method converts the resolution of video signals, the method comprising: calculating up-sampling and down-sampling ratios based on the resolution of an input video signal and the desired resolution of an output video signal; calculating a number of filter tabs by multiplying the up-sampling and down-sampling ratios by a number of side lobes; calculating first filter coefficients of the same number of the filter tabs by multiplying a window function by a sinc function; calculating final filter coefficients by subtracting a result of a multiplication of a Gaussian function by the window function from the first filter coefficients, and then normalizing the final filter coefficients; and performing filtering in vertical and horizontal directions based on the final filter coefficients by modifying a sampling rate of an input video signal depending on the up-sampling and down-sampling ratios.

The up-sampling and down-sampling ratios may be calculated by using a greatest common measure of both a number of samples of the input video signal and a number of samples of a video signal having a desired definition.

The number of filter tabs may be calculated by using an equation:

$$T = \text{round}(\max\{U,D\} \times \text{SmoothingAmount} \times (\text{nLobes}-1)) \times 2+1,$$

where T is the number of filter tabs, nLobes is the number of side lobes, U and D are optimal up-sampling and down-sampling ratios, and SmoothingAmount is a constant for modifying a cut-off frequency of the filter.

The value of SmoothingAmount may be set to be less than 1, and the value of nLobes may be set to be less than 2.

The first filter coefficients may be calculated by using an equation:

$$h[i] = \left\{\frac{\sin(x)}{x}\right\} \times Kaiser(i, \beta), i = 0, 1, \ldots, T-1,$$

-continued $$x = \frac{i - \frac{T-1}{2}}{\frac{T-1}{2}} \times \pi \times nLobes$$

where, sin(x)/x is an ideal low frequency band pass function, and Kaiser(I, β) is a Kaiser window function.

The final filter coefficients may be defined as:

$$h[i] = \left[\frac{\sin(x)}{x} - ES \cdot Gaussian(x)\right] \cdot Kaiser(i, \beta),$$

$$i = 0, 1, \ldots, T-1, x = \frac{i - \frac{T-1}{2}}{\frac{T-1}{2}} \times \pi \times nLobes$$

where ES is a parameter for determining a magnitude of a high frequency signal in a pass band, and Kaiser(i, β) is a Kaiser window function.

According to another embodiment of the present invention, an apparatus converts resolution of video signals, the apparatus comprising: a unit to calculate up-sampling and down-sampling ratios based on a resolution of an input video signal and a desired resolution of an output video signal; a unit to calculate a number of filter tabs by multiplying up-sampling and down-sampling ratios by a number of side lobes; a unit to calculate first filter coefficients of the same number of the filter tabs by multiplying a window function by a sinc function; a unit to calculate final filter coefficients by subtracting a result of a multiplication of a Gaussian function by a window function from the first filter coefficients, and then normalizing the final filter coefficients; and first and second scaling filters to perform filtering in vertical and horizontal directions, respectively, based on the final filter coefficients by modifying a sampling rate of an input video signal depending on the up-sampling and down-sampling ratios.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
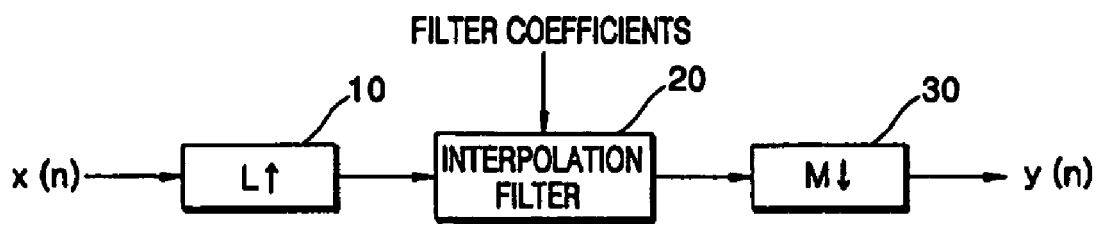
FIG. 1 is a block diagram illustrating a sampling rate conversion for input video signals according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

FIG. 1 is a block diagram illustrating a sampling rate conversion for input video signals according to an embodiment of the present invention. According to a typical sampling conversion technique, the up-sampler 10 performs a zero insertion between the pixels of an input video signal x(n) and outputs an up-sampled video signal. The interpolation filter 20 performs low pass filtering for the up-sampled video signal based on a received filter coefficient, and the down-sampler 30 performs down-sampling for the filtered video signal suitably for a desired resolution.

Figure 2:
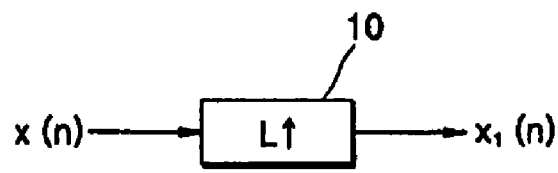
FIG. 2 is a block diagram illustrating an L-fold up-sampler in FIG. 1.

FIG. 2 is a block diagram illustrating an L-fold up-sampler in FIG. 1. The L-fold up-sampler inserts (L−1) zeros between the samples of the L-fold up-sampled input video signal. Supposing that samples of the input signal are x(n)={ ..., 3, 5, 9, 6, ... } and L=4, samples of the output signal $x_1$(n) become $x_1$(n)={ ..., 3, 0, 0, 0, 5, 0, 0, 0, 9, 0, 0, 0, 6, 0, 0, 0, ... }, that is, three zeros are inserted between each of the samples of the input signal x(n). This can be represented by the following general expression.

$x_1(n)=[L]X(n)=x(n/L)$; when n is a multiple of L=0; otherwise      Equation 1

Figure 3A:
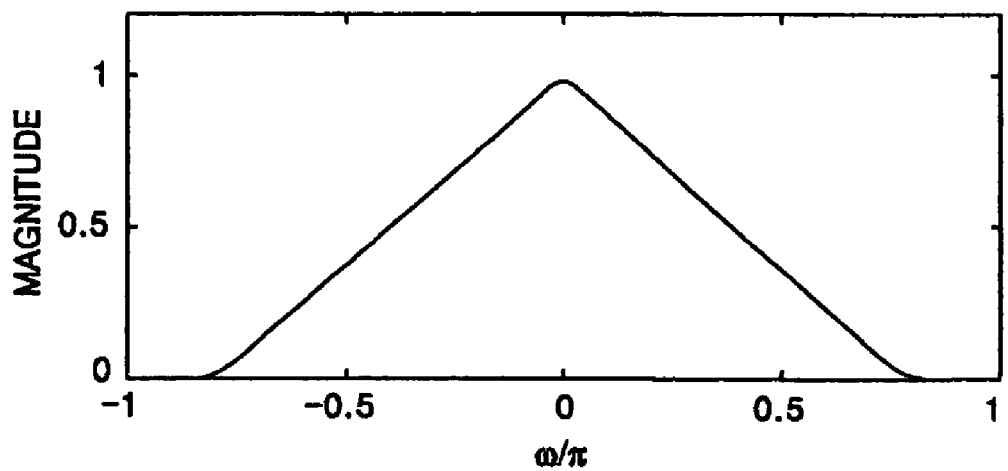
FIG. 3A illustrates a spectrum of an input signal x(n) in FIG. 2.
Figure 3B:
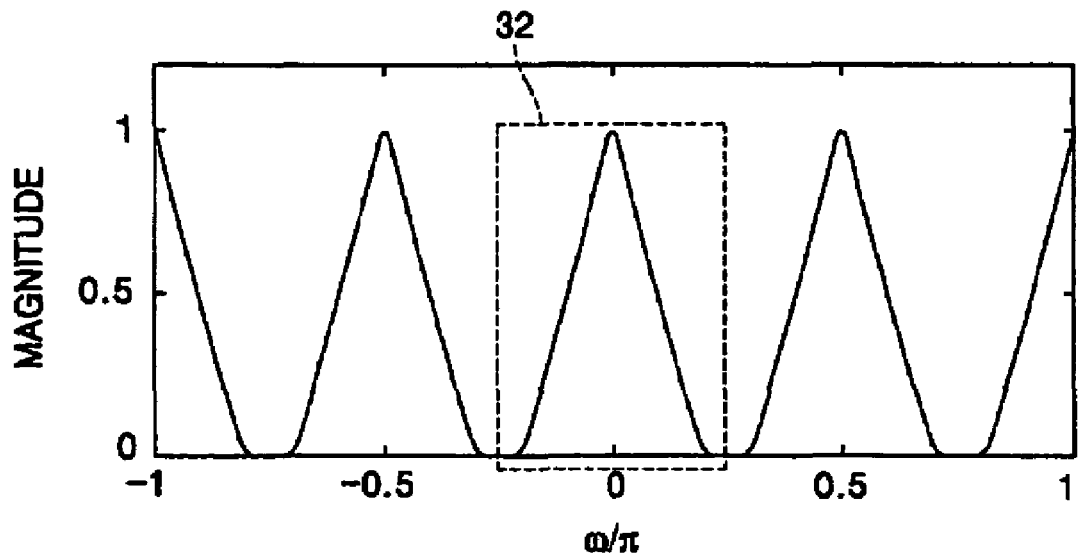
FIG. 3B illustrates a spectrum in which samples of the input signal x(m) in FIG. 2 are up-sampled by L.
Figure 4:
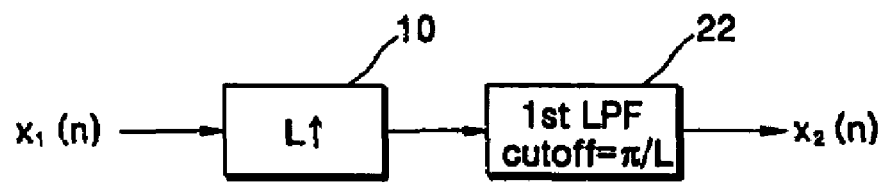
FIG. 4 is a block diagram illustrating a first low pass filter connected to the L-fold up-sampler in FIG. 2.

FIG. 3A illustrates a spectrum of an input signal x(n) in FIG. 2. FIG. 3B illustrates a spectrum in which samples of the input signal x(n) in FIG. 2 are up-sampled by L. FIG. 4 is a block diagram illustrating a first low pass filter 22 connected to the L-fold up-sampler 10 in FIG. 2.

The spectrum of the input signal x(n) is compressed into (L-1) spectral components with a range of −π~+π. The first low pass filter 22 has a cut-off frequency set at π/L to pass only the spectral components 32 positioned in a low frequency band in the spectrum of the compressed input signal $x_1$(n) as shown in FIG. 3B.

Figure 5:
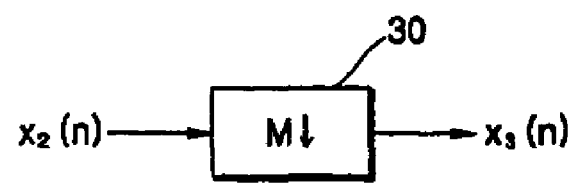
FIG. 5 is a block diagram illustrating an M-fold down-sampler in FIG. 1.

FIG. 5 is a block diagram illustrating an M-fold down-sampler 30. The M-fold down-sampler is a circuit from which an input signal is output without being altered only when the position of the input sample is an integer multiple of M. Supposing that the samples of the input signal $x_2(n)$ are $x_2(n)=\{\ldots, 7, 3, 5, 2, 9, 6, 4, \ldots\}$, M=2, and $x_2(0)=5$, the samples of the output signal become $x_3(n)=\{\ldots, 7, 5, 9, 4, \ldots\}$. This can be represented as the following general expression.

$$x_3(n)=[\downarrow M]X_2(n)=x_2(n/M), \text{ when n is a multiple of}$$
$$M=0, \text{ otherwise} \qquad \text{Equation 2}$$

Figure 6A:
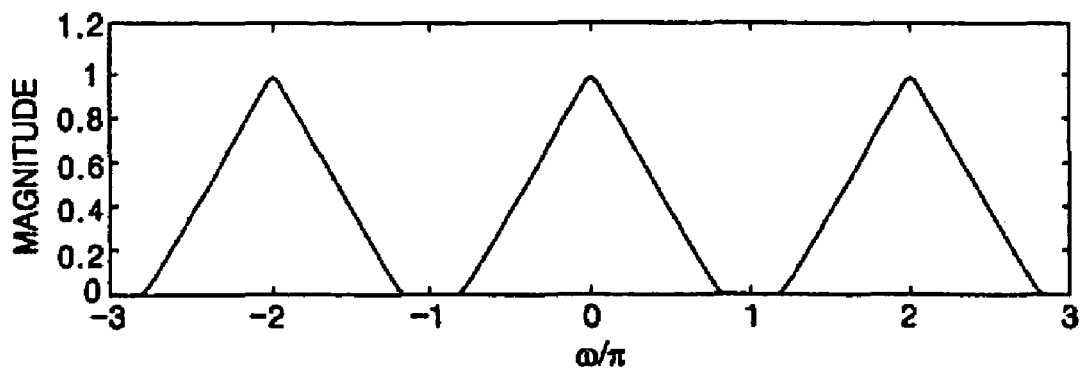
FIG. 6A illustrates a spectrum of an input signal $x_2$(n) in FIG. 5.
Figure 6B:
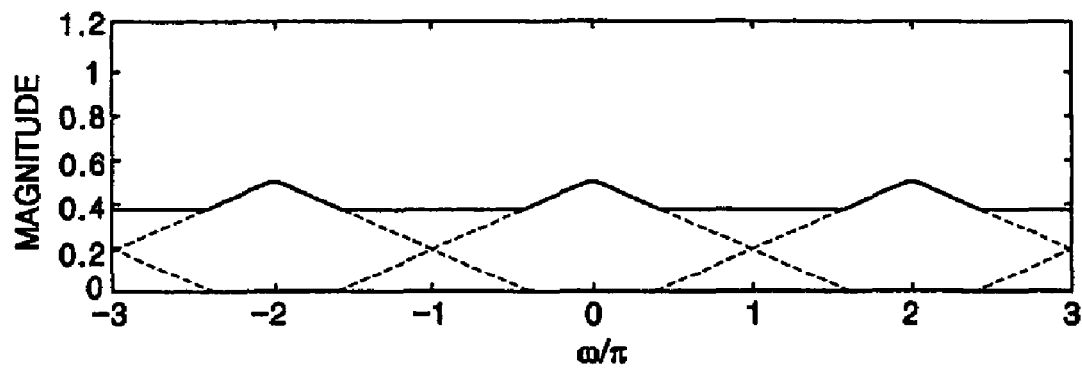
FIG. 6B illustrates a spectrum in which samples of the input signal $x_2$(n) in FIG. 5 are down-sampled by M.
Figure 7:
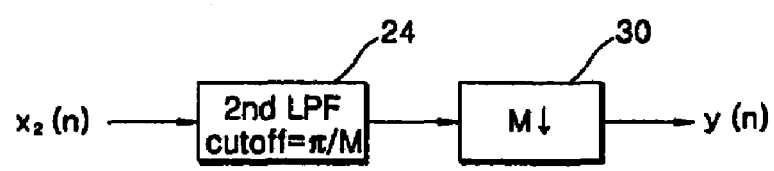
FIG. 7 is a block diagram illustrating a second low pass filter connected to the M-fold down-sampler in FIG. 5.
Figure 8:
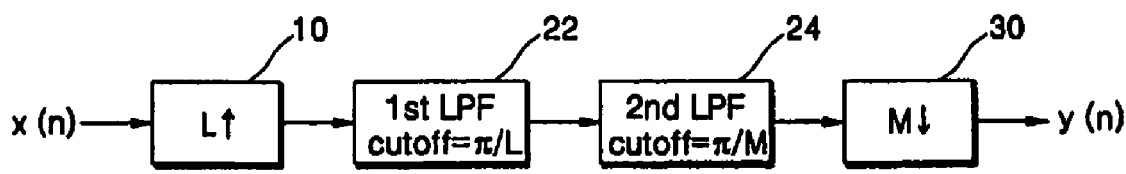
FIG. 8 is a block diagram illustrating integrating the up-sampling and down-sampling processing units in FIGS. 4 and 7.

FIG. 6A illustrates a spectrum of an input signal $x_2(n)$ in FIG. 5. FIG. 6B illustrates a spectrum in which samples of the input signal $x_2(n)$ in FIG. 5 are down-sampled by M. FIG. 7 is a block diagram illustrating a second low pass filter 24 connected to the M-fold down-sampler in FIG. 5. Frequency bandwidths of the spectra shown in FIGS. 6A and 6B have been adjusted to give a convenient description.

The spectrum of the M-fold down-sampled signal $x_3(n)$ is formed by extending the input signal $x_2(n)$ by X[M] to have (M−1) spectral components, so that an aliasing occurs due to a superposition with the spectrum of the input signal $x_2(n)$. To prevent such an aliasing, the input signal $x_2(n)$ is passed through the second low pass filter 24 having its cut-off frequency of $\pi/M$ before down-sampling as shown in FIG. 7. In addition, to remove additional spectral components caused by the up-sampling and to prevent the aliasing caused by the down-sampling, the interpolation filter 20 in FIG. 1 is set to have the lowest cut-off frequency, min($\pi/L$, $\pi/M$), of the first and second low pass filters 22 and 24.

There are a variety of methods of evaluating a filter coefficient of the interpolation filter 20, a finite impulse response (FIR) filter. According to the present invention, a window-based design method is adopted due to the convenience of controlling the amount of stop band attenuation and a transition bandwidth, which is important for determining a filter property.

Figure 9:
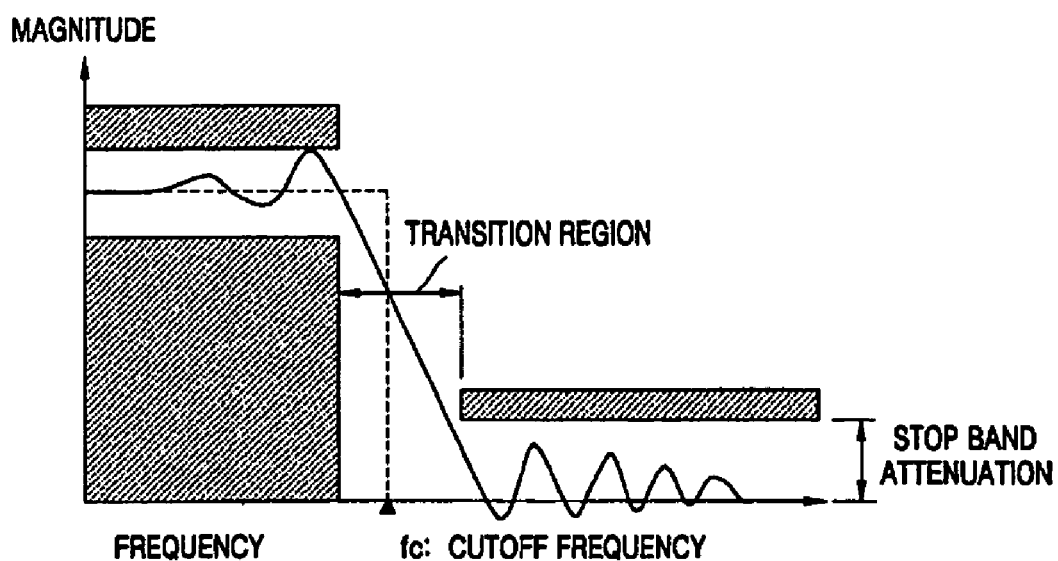
FIG. 9 is a schematic diagram showing a cut-off frequency, a transition bandwidth, and an amount of stop band attenuation considered during filter designing in an embodiment of the present invention.

FIG. 9 is a schematic diagram showing a cut-off frequency, a transition bandwidth, and an amount of stop band attenuation considered during filter designing in an embodiment of the present invention. During the filter designing, a narrow transition bandwidth and a large amount of stop band attenuation may prevent the video quality deterioration, such as ringing and aliasing which are caused by the filtering. The type of the window function determines the frequency characteristics of the filter. That is, as the width of a main lobe of the window function becomes narrower, the designed filter has a larger amount of stop band attenuation.

In the fields of the filter designing, various kinds of window functions are being adopted to optimize the transition bandwidth and the amount of stop band attenuation. According to the present invention, a Kaiser window function is adopted because the bandwidth of the main lobe and the ripple of the side lobe of the window function may be conveniently controlled.

An impulse response h(n) of a typical window function may be expressed as the following equation.

$$h(n)=h_d(n)\times w(n) \qquad \text{Equation 3}$$

where, $h_d(n)$ is an impulse response of an ideal low pass filter, and w(n) is a window function.

The window function w(n) may be expressed as the following equation, the Kaiser window function.

$$Kaiser(n, \beta) = \frac{I_0[\beta(1-[(n-\alpha)/\alpha^2]^{1/2}]}{I_0(\beta)}, \quad 0 \leq n \leq T, \alpha = T/2$$
$$= 0, \qquad \text{otherwise} \qquad \text{Equation 4}$$

where T is the number of filter tabs, $I_0$ is a modified zero-order Bessel function, and $\alpha$ and $\beta$ are coefficients to determine a configuration of a Kaiser window. The frequency characteristics of the Kaiser window function are determined by coefficients $\beta$ and T. As the $\beta$ increases, the stop band attenuation decreases. As the T increases, the main lobe of the window function becomes narrower. Therefore, the transition bandwidth is reduced.

Ideally, the interpolation filter 20 to convert a resolution should have a frequency response which is flat in the pass band and which has a larger amount of attenuation in the stop band to prevent aliasing. Particularly, in the multiples of the sampling frequency, the interpolation filter 20 generally has a very high stop band attenuation to prevent aliasing in direct current (DC) components of the input signal because the aliasing may be recognized accurately by the naked eye. In addition, to prevent ringing and overshooting in the edge regions of images, it is recommended that the impulse response of the interpolation filter 20 have a smaller number of side lobe components and smaller side lobes.

According to the present invention, when determining the filter coefficients, a filter tab number (T) is calculated by using the stop band attenuation and the transition region bandwidth, which are not in a trade-off, as is shown in the following equation.

$$T=\text{round}(\max\{U,D\}\times\text{SmoothingAmount}\times(n\text{Lobes}-1))\times 2+1 \qquad \text{Equation 5}$$

where round is a rounding function, nLobes is the number of side lobes in the impulse response, and U and D are optimal up-sampling and down-sampling ratios, respectively. A greatest common measure of both the number of samples in the input signal and the number of samples in the output signal is calculated, and then the numbers of the samples in the input signal and the output signal are each divided by the greatest common measure to obtain optimal up-sampling and down-sampling ratios, respectively. The optimized up-sampling and down-sampling ratios are used to determine the cut-off frequency of the filter. Typically, the number of side lobes in the impulse response is directly proportional to the number of the filter tabs (T). The number of filter tabs (T) may be calculated by multiplying the number of side lobes (nLobes) by the up-sampling and down-sampling ratios. Herein, SmoothingAmounting is a parameter for modifying the cut-off frequency of the filter, and becomes directly proportional to the number of filter tabs and the cut-off frequency if the number of side lobes is determined. It is for this reason that the equation to calculate the number of filter tabs includes the parameter, SmoothingAmounting.

Generally, SmoothingAmounting is set to be less than 1, and nLobes is set to be less than 2 in the Equation 5. A filter coefficient h[i] may be obtained from the following equation.

$$h[i] = \left\{\frac{\sin(x)}{x}\right\} \times Kaiser(i, \beta), \ i = 0, 1, \ldots, T-1, \quad \text{Equation 6}$$

$$x = \frac{i - \frac{T-1}{2}}{\frac{T-1}{2}} \times \pi \times nLobes$$

where x is a scaling constant factor to allow the sinc function to have the number of side lobes integrated in the Equation 5 within the range of zero and the number of filter tabs (0~L−1). The filter coefficients calculated by the Equation 6 are normalized to produce a constant output signal for a constant continuous input signal, that is, a flat signal.

Since an interpolation filter is typically used as a method of changing a sampling rate, spectrum attenuation is generated in the high frequency band of the input signal. This causes a degradation of the definition in the filtered video, which would be readily recognized. To compensate for this problem, according to an embodiment of the present invention, the magnitude of the frequency response of the high frequency signal in the pass band of the filter is forced to increase with the number of the filter tabs remaining constant during the generation of the filter coefficients, thus improving the definition. For this purpose, a Gaussian function is subtracted from the original filter kernel in Equation 6 to calculate the filter coefficients as expressed in the following Equation 7. Subsequently, the final filter coefficients are obtained by normalization.

$$h[i] = \left[\frac{\sin(x)}{x} - ES \cdot Gaussian(x)\right] \cdot Kaiser(i, \beta), \quad \text{Equation 7}$$

$$i = 0, 1, \ldots, T-1, \ x = \frac{i - \frac{T-1}{2}}{\frac{T-1}{2}} \times \pi \times nLobes$$

where ES is a control factor to determine a magnitude of a high frequency signal in a pass band. Supposing that H(W) is a frequency response calculated by using the filter coefficient obtained from Equation 6, and G(W) is a frequency response, Gaussian(x). Kaiser(i, β) of the Gaussian filter in Equation 7, the final frequency response of the filter generated from Equation 7 may be expressed as H(W)−ES×G(W). Herein, as the gain ES of the high frequency signal becomes smaller, the final frequency response becomes closer to the original frequency response H(W) of the filter. In addition, as the control factor ES increases, the magnitude response gain in the low frequency band decreases. Such a smaller magnitude response may be compensated for by normalizing the filter coefficient.

Figure 10A:
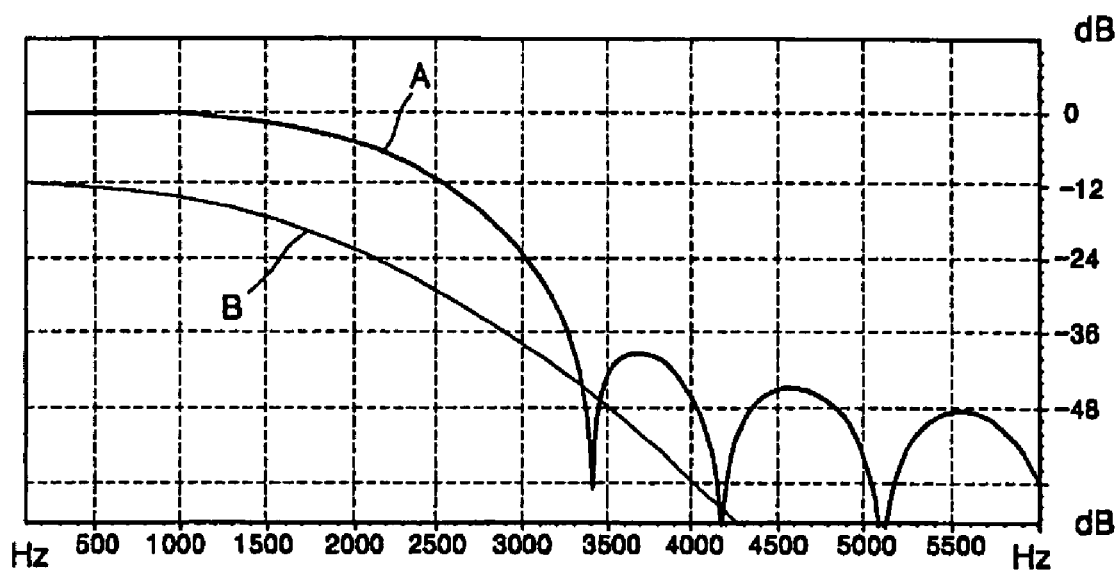
FIGS. 10A, 10B, and 10C are graphs of frequency responses.

FIG. 10A shows a graph of a frequency response when filtering is performed by using the interpolation filter in FIG. 1 and the filter coefficients in Equation 6 according to an embodiment of the present invention. Herein, A is a frequency response, and B is a frequency response of a Gaussian function.

Figure 10B:
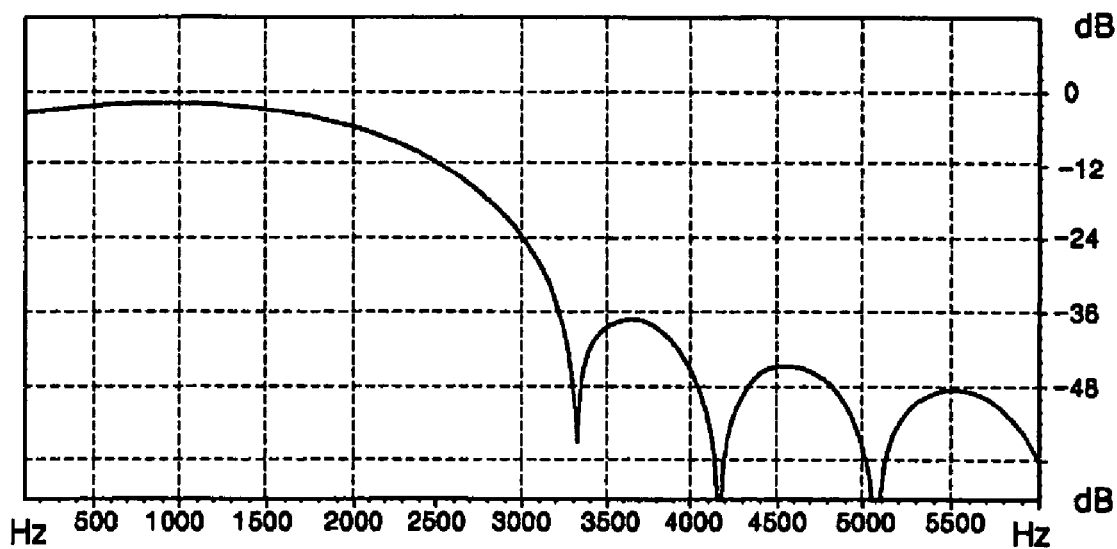

FIG. 10B shows a graph of a frequency response when filtering is performed by using the interpolation filter in FIG. 1 and the filter coefficient in Equation 7.

Figure 10C:
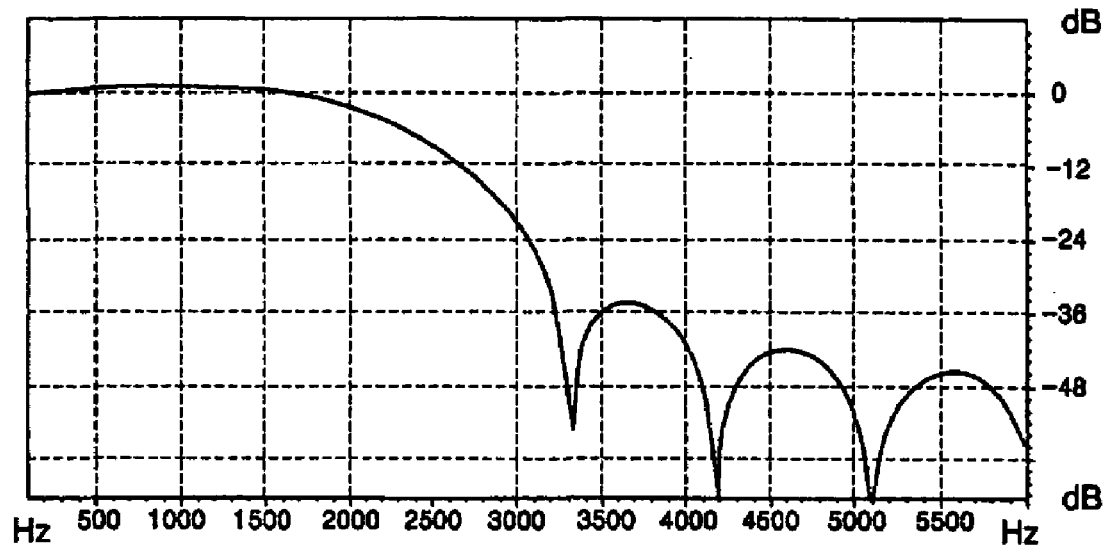

FIG. 10C shows a graph of a frequency response when the filter coefficients applied in FIG. 10B are normalized, and then filtering is performed. It is recognized that the high frequency components in the input signal may be effectively emphasized without modifying the number of filter tabs.

Figure 11:
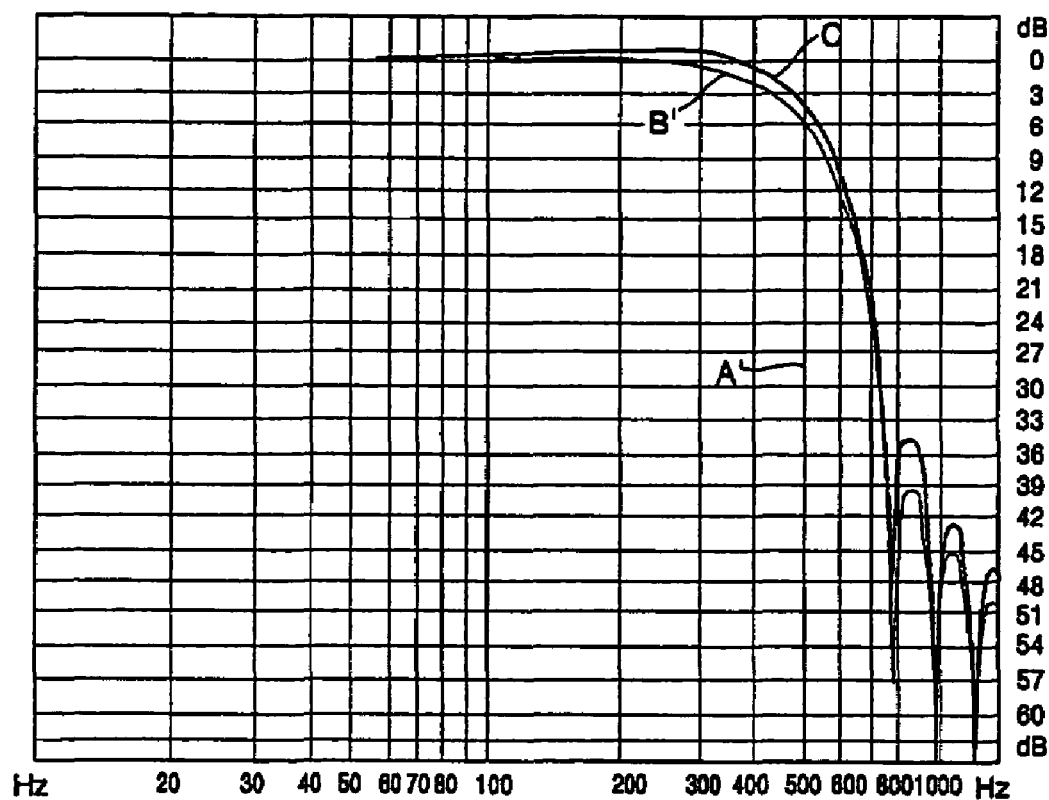
FIG. 11 is a graph showing a frequency response of a low pass filter having a cut-off frequency of 500 Hz according to an embodiment of the present invention.

FIG. 11 is a graph showing a frequency response of a low pass filter having a cut-off frequency of 500 Hz according to an embodiment of the present invention. In FIG. 11, A' is a frequency response of an ideal low pass filter, B' is a frequency response obtained by using the filter coefficients in Equation 6 according to an embodiment of the present invention, and C is a frequency response of a filter in which the magnitude of high frequency components in the pass band is enhanced based on the filter coefficients obtained from Equation 7.

As shown in FIG. 11, high frequency components in the pass band may be effectively increased without any degradation of the stop band attenuation in the high frequency band. This improves video definition.

Figure 12:
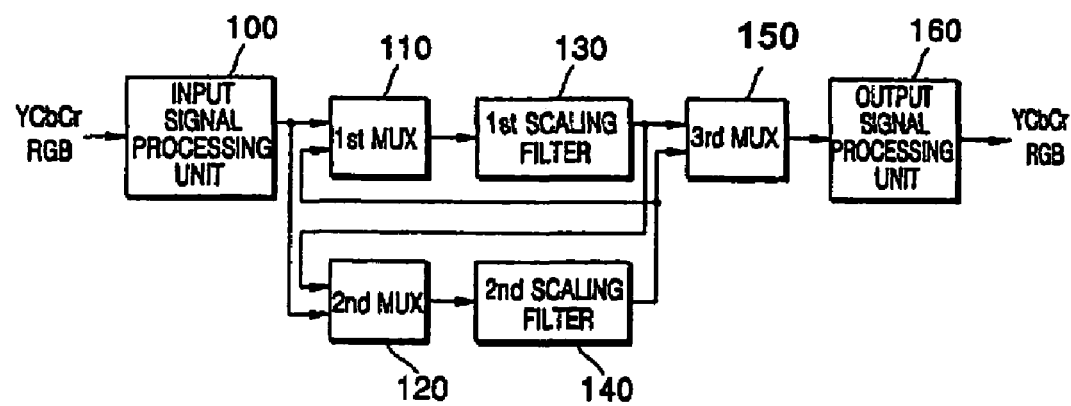
FIG. 12 is a block diagram illustrating a typical resolution conversion unit of a method of converting resolution according to an embodiment of the present invention.

Referring to FIG. 12, a block to convert a resolution with respect to the vertical and horizontal directions of the video signals YCbCr and RGB is illustrated. The video signal divided into the vertical and horizontal directions in the input signal processing unit 100 is applied to first and second scaling filters 130 and 140 through first and second multiplexers 110 and 120, respectively, and then converted to have a desired resolution. After the filtering, the signal is output to the output signal processing unit 160 through the third multiplexer unit 150. Herein, each of the first and second scaling filters 130 and 140 is a sampling conversion block including an interpolation filter 20 as shown in FIG. 1 that performs filtering for video signals based on the filter coefficients input from a unit to calculate filter coefficients (not shown in the drawings) so that a high definition video may be provided even after converting a resolution.

According to the present invention, since a resolution of an output video may be freely converted, video of different resolutions may be supported in a variety of digital display devices. Additionally, in spite of the fact that the transition region bandwidth and the stop band attenuation of the interpolation filter are in a trade-off, the transition region bandwidth and the stop band attenuation of the interpolation filter may be used to calculate optimal filter coefficients and to control the interpolation filter. Therefore, high definition output video signals are provided without adding a peaking circuit or a definition enhancement circuit.

Also, it is possible to control the definition, aliasing and ringing properties of the output video accurately by controlling the control factor ES in the equation that calculates filter coefficients.

The present invention may be embodied as a program stored on a computer readable medium that can be run on a general computer. Here, the computer readable medium includes, but is not limited to, storage media such as magnetic storage media (e.g., ROM's, floppy disks, hard disks, and the like), and optically readable media (e.g., CD-ROMs, DVDs, etc.), and excludes carrier waves (e.g., transmission over the Internet). The present invention may also be embodied as a computer readable program code unit stored on a computer readable medium, for causing a number of computer systems connected via a network to affect distributed processing.

In one embodiment, an apparatus to convert resolution of an input video signal in accordance with the present invention comprises, the apparatus comprises: a video signal resolution processing unit to divide the input video signal into vertical and horizontal direction components; and a bi-level filtering system to perform filtering in vertical and horizontal directions based on final filter coefficients by modifying a sampling rate of the input video signal depending on up-sampling and down-sampling ratios.

The bi-level filtering system calculates up-sampling and down-sampling ratios based on a resolution of the input video signal and a desired resolution of an output video signal; calculates a number of filter tabs by multiplying up-sampling and down-sampling ratios by a number of side lobes; calculates first filter coefficients of a same number of the filter tabs by multiplying a window function by a sinc function; calculates final filter coefficients of a filter by subtracting a result of a multiplication of a Gaussian function by a window function from the first filter coefficients, and then normalizing the final filter coefficients; performs filtering in vertical and horizontal directions based on the final filter coefficients by modifying a sampling rate of an input video signal depending on the up-sampling and down-sampling ratios; and scales a combined output from the filtering in vertical and horizontal directions and converts the scaled combined output to a desired resolution.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of converting resolution of an input video signal, the method comprising:
    calculating up-sampling and down-sampling ratios based on a resolution of the input video signal and a desired resolution of an output video signal;
    calculating a number of filter tabs by multiplying up-sampling and down-sampling ratios by a number of side lobes;
    calculating first filter coefficients of a same number of filter tabs by multiplying a window function by a sinc function;
    calculating final filter coefficients of a filter by subtracting a result of a multiplication of a Gaussian function by the window function from the first filter coefficients, and then normalizing the final filter coefficients; and
    performing filtering in vertical and horizontal directions based on the final filter coefficients by modifying a sampling rate of the input video signal depending on the up-sampling and down-sampling ratios.

2. The method according to claim 1, wherein the up-sampling and down-sampling ratios are calculated by using a greatest common measure of both a number of samples of the input video signal and a number of samples of a video signal having a desired definition.

3. The method according to claim 1, wherein the number of filter tabs is calculated by using an equation:

$$T = \text{round}(\max\{U, D\} \times \text{SmoothingAmount} \times (\text{nLobes} - 1)) \times 2 + 1,$$

where T is the number of filter tabs, nLobes is the number of side lobes, U and D are optimal up-sampling and down-sampling ratios, and SmoothingAmount is a constant for modifying a cut-off frequency of the filter.

4. The method according to claim 3, wherein a value of SmoothingAmount is set to be less than 1, and a value of nLobes is set to be less than 2.

5. The method according to claim 3, wherein the first filter coefficients are calculated by using an equation:

$$h[i] = \left\{\frac{\sin(x)}{x}\right\} \times \text{Kaiser}(i, \beta),\ i = 0, 1, \ldots, T-1,$$

$$x = \frac{i - \frac{T-1}{2}}{\frac{T-1}{2}} \times \pi \times \text{nLobes}$$

where, $\sin(x)/x$ is an ideal low frequency band pass function, and $\text{Kaiser}(I, \beta)$ is a Kaiser window function.

6. The method according to claim 5, wherein the final filter coefficients are defined as:

$$h[i] = \left[\frac{\sin(x)}{x} - ES \cdot \text{Gaussian}(x)\right] \cdot \text{Kaiser}(i, \beta),$$

$$i = 0, 1, \ldots, T-1,\ x = \frac{i - \frac{T-1}{2}}{\frac{T-1}{2}} \times \pi \times \text{nLobes}$$

where ES is a parameter to determine a magnitude of a high frequency signal in a pass band, and $\text{Kaiser}(i, \beta)$ is a Kaiser window function.

7. The method of claim 1, wherein a sampling rate conversion for the input video signal comprises using an up-sampler to perform a zero insertion between pixels of the input video signal and to output an up-sampled video signal.

8. The method of claim 7, further including using an interpolation filter to perform low pass filtering for the up-sampled video signal based on a received filter coefficient, and using a down-sampler to perform down-sampling of the filtered video signal for a desired resolution.

9. The method of claim 7 wherein the up-sampler is an L-fold up-sampler that inserts (L−1) zeros between samples of an L-fold up-sampled input video signal, wherein L is a preselected integer, x(n) is the input video signal and $x_1(n)$ is an output signal, in accordance with Equation 1:

$$x_1(n) = [\uparrow L]X(n) = x(n/L);\ \text{when n is a multiple of}$$
$$L = 0;\ \text{otherwise} \qquad \text{Equation 1.}$$

10. The method of claim 9, wherein a spectrum of the input video signal x(n) is compressed into (L−1) spectral components with a range of $-\pi \sim +\pi$ and a first low pass filter has a cut-off frequency set at $\pi/L$ to pass only spectral components positioned in a low frequency band in a spectrum of the compressed input signal $x_1(n)$.

11. The method of claim 10, wherein an M-fold down-sampler is a circuit from which an input signal is output without being altered only when a position of an input sample is an integer multiple of M, wherein M is a preselected integer, $x_2(n)$ is the input signal and $x_3(n)$ is an output signal represented as in Equation 2:

$$x_3(n) = [\downarrow M]X_2(n) = x_2(n/M),\ \text{when n is a multiple of}$$
$$M = 0,\ \text{otherwise} \qquad \text{Equation 2.}$$

12. The method of claim 6, wherein definition, aliasing and ringing properties of the output video signal are controlled by controlling the parameter/control factor ES in the equation that calculates the final filter coefficients.

13. An apparatus to convert resolution of an input video signal, the apparatus comprising:
    a first unit to calculate up-sampling and down-sampling ratios based on a resolution of the input video signal and a desired resolution of an output video signal;

a second unit to calculate a number of filter tabs by multiplying up-sampling and down-sampling ratios by a number of side lobes;

a third unit to calculate first filter coefficients of a same number of the filter tabs by multiplying a window function by a sinc function;

a fourth unit to calculate final filter coefficients of a filter by subtracting a result of a multiplication of a Gaussian function by a window function from the first filter coefficients, and then normalizing the final filter coefficients; and first and second scaling filters to perform filtering in vertical and horizontal directions based on the final filter coefficients by modifying a sampling rate of the input video signal depending on the up-sampling and down-sampling ratios.

14. A computer readable medium having recorded thereon a computer readable program having computer-executable instructions for converting resolution of an input video signal, the computer instructions excluding carrier waves and comprising:

calculating up-sampling and down-sampling ratios based on a resolution of the input video signal and a desired resolution of an output video signal;

calculating a number of filter tabs by multiplying up-sampling and down-sampling ratios by a number of side lobes;

calculating first filter coefficients of a same number of filter tabs by multiplying a window function by a sinc function;

calculating final filter coefficients of a filter by subtracting a result of a multiplication of a Gaussian function by the window function from the first filter coefficients, and then normalizing the final filter coefficients; and performing filtering in vertical and horizontal directions based on the final filter coefficients by modifying a sampling rate of the input video signal depending on the up-sampling and down-sampling ratios.

15. The computer readable medium according to claim 14, wherein the up-sampling and down-sampling ratios are calculated by using a greatest common measure of both a number of samples of the input video signal and a number of samples of a video signal having a desired definition.

16. The computer readable medium according to claim 14, wherein the number of filter tabs is calculated by using an equation:

$$T = \text{round}(\max\{U,D\} \times \text{SmoothingAmount} \times (\text{nLobes}-1)) \times 2 + 1,$$

where T is the number of filter tabs, nLobes is the number of side lobes, U and D are optimal up-sampling and down-sampling ratios, and SmoothingAmount is a constant for modifying a cut-off frequency of the filter.

17. The computer readable medium according to claim 16, wherein a value of SmoothingAmount is set to be less than 1, and a value of nLobes is set to be less than 2.

18. The computer readable medium according to claim 16, wherein the first filter coefficients are calculated by using an equation:

$$h[i] = \left\{ \frac{\sin(x)}{x} \right\} \times Kaiser(i, \beta), i = 0, 1, \ldots, T-1,$$

$$x = \frac{i - \frac{T-1}{2}}{\frac{T-1}{2}} \times \pi \times nLobes$$

where, sin(x)/x is an ideal low frequency band pass function, and Kaiser(I, β) is a Kaiser window function.

19. The computer readable medium according to claim 18, wherein the final filter coefficients are defined as:

$$h[i] = \left[ \frac{\sin(x)}{x} - ES \cdot Gaussian(x) \right] \cdot Kaiser(i, \beta),$$

$$i = 0, 1, \ldots, T-1, x = \frac{i - \frac{T-1}{2}}{\frac{T-1}{2}} \times \pi \times nLobes$$

where ES is a parameter to determine a magnitude of a high frequency signal in a pass band, and Kaiser(i, β) is a Kaiser window function.

20. An apparatus to convert resolution of an input video signal, the apparatus comprising:

an input signal processing unit to divide the input video signal into vertical and horizontal direction components;

first and second multiplexers to apply the vertical and horizontal direction components to first and second scaling filters;

the first and second scaling filters to scale the vertical and horizontal direction components according to a predetermined scheme;

a third multiplexer to combine an output of the first and second scaling filters to provide a scaled output to an output signal processing unit; and the output signal processing unit to convert the scaled output to a desired resolution.

21. The apparatus according to claim 20, wherein, in accordance with the predetermined scheme, each of the first and second scaling filters comprises a sampling conversion block that includes an interpolation filter having a filter coefficient determining unit and performs filtering based on filter coefficients input from the filter coefficient determining unit.

22. The apparatus according to claim 21, wherein the filter coefficient determining unit:

calculates up-sampling and down-sampling ratios based on a resolution of the input video signal and a desired resolution of an output video signal;

calculates a number of filter tabs by multiplying up-sampling and down-sampling ratios by a number of side lobes;

calculates first filter coefficients of a same number of filter tabs by multiplying a window function by a sinc function; and calculates final filter coefficients of a filter by subtracting a result of a multiplication of a Gaussian function by the window function from the first filter coefficients, and then normalizing the final filter coefficients.

23. The apparatus according to claim 22, wherein the interpolation filter performs filtering in vertical and horizontal directions based on the final filter coefficients by modifying a sampling rate of the input video signal depending on the up-sampling and down-sampling ratios.

24. The apparatus according to claim 22, wherein the up-sampling and down-sampling ratios are calculated by using a greatest common measure of both a number of samples of the input video signal and a number of samples of a video signal having a desired definition.

25. The apparatus according to claim 22, wherein the number of filter tabs is calculated by using an equation:

$$T = \text{round}(\max\{U,D\} \times \text{SmoothingAmount} \times (\text{nLobes}-1)) \times 2+1,$$

where T is the number of filter tabs, nLobes is the number of side lobes, U and D are optimal up-sampling and down-sampling ratios, and SmoothingAmount is a constant for modifying a cut-off frequency of the filter.

26. The apparatus according to claim 25, wherein a value of SmoothingAmount is set to be less than 1, and a value of nLobes is set to be less than 2.

27. The apparatus according to claim 22, wherein the first filter coefficients are calculated by using an equation:

$$h[i] = \left\{\frac{\sin(x)}{x}\right\} \times Kaiser(i, \beta), i = 0, 1, \ldots, T-1,$$

$$x = \frac{i - \frac{T-1}{2}}{\frac{T-1}{2}} \times \pi \times nLobes$$

where, $\sin(x)/x$ is an ideal low frequency band pass function, and Kaiser(I, $\beta$) is a Kaiser window function.

28. The apparatus according to claim 22, wherein the final filter coefficients are defined as:

$$h[i] = \left[\frac{\sin(x)}{x} - ES \cdot Gaussian(x)\right] \cdot Kaiser(i, \beta),$$

$$i = 0, 1, \ldots, T-1, x = \frac{i - \frac{T-1}{2}}{\frac{T-1}{2}} \times \pi \times nLobes$$

where ES is a parameter to determine a magnitude of a high frequency signal in a pass band, and Kaiser(i, $\beta$) is a Kaiser window function.

29. An apparatus to convert resolution of an input video signal, the apparatus comprising:
a video signal resolution processing unit to divide the input video signal into vertical and horizontal direction components; and
a bi-level filtering system to perform filtering in vertical and horizontal directions based on final filter coefficients by modifying a sampling rate of the input video signal depending on up-sampling and down-sampling ratios,
wherein the bi-level filtering system comprises:
first and second multiplexers to apply the vertical and horizontal direction components to first and second scaling filters;
the first and second scaling filters to scale the vertical and horizontal direction components according to a predetermined scheme;
a third multiplexer to combine an output of the first and second scaling filters to provide a scaled output to an output signal processing unit; and
the output signal processing unit to convert the scaled output to a desired resolution.

30. The apparatus of claim 29, wherein the bi-level filtering system:
calculates up-sampling and down-sampling ratios based on a resolution of the input video signal and a desired resolution of an output video signal;
calculates a number of filter tabs by multiplying up-sampling and down-sampling ratios by a number of side lobes;
calculates first filter coefficients of a same number of the filter tabs by multiplying a window function by a sinc function;
calculates final filter coefficients of a filter by subtracting a result of a multiplication of a Gaussian function by a window function from the first filter coefficients, and then normalizing the final filter coefficients;
performs filtering in vertical and horizontal directions based on the final filter coefficients by modifying a sampling rate of an input video signal depending on the up-sampling and down-sampling ratios; and
scales a combined output from the filtering in vertical and horizontal directions and converts the scaled combined output to a desired resolution.

\* \* \* \* \*

UNITED STATES PATENT AND TRADEMARK OFFICE
CERTIFICATE OF CORRECTION

PATENT NO.       : 7,375,767 B2
APPLICATION NO.  : 10/994279
DATED            : May 20, 2008
INVENTOR(S)      : Hoyoung Lee et al.

It is certified that error appears in the above-identified patent and that said Letters Patent is hereby corrected as shown below:

Column 10, Line 12, change "Kaiser(I,β)" to --Kaiser(i,β)--.

Column 10, Line 41, change "$x_1,(n)$:" to --$x_1(n)$--.

Column 10, Line 56, change "$x_2(n/M)$," to --$x_2(n/L)$,--.

Column 12, Line 12, change "Kaiser(I,β)" to --Kaiser(i,β)--.

Column 13, Line 32, change "Kaiser(I,β)" to --Kaiser(i,β)--.

Signed and Sealed this

Seventh Day of October, 2008

JON W. DUDAS
*Director of the United States Patent and Trademark Office*